United States Patent [19]

Tanoue et al.

[11] Patent Number: 5,229,623

[45] Date of Patent: Jul. 20, 1993

[54] ELECTRIC CIRCUIT USING MULTIPLE DIFFERENTIAL NEGATIVE RESISTANCE ELEMENTS, SEMICONDUCTOR DEVICE AND NEURO CHIP USING THE SAME

[75] Inventors: Tomonori Tanoue, Ebina, Japan; Hiroshi Mizuta, Cambridge, United Kingdom; Susumu Takahashi, Tokyo, Japan

[73] Assignee: Hitachi, Ltd., Tokyo, Japan

[21] Appl. No.: 746,288

[22] Filed: Aug. 13, 1991

Related U.S. Application Data

[63] Continuation of Ser. No. 421,642, Oct. 16, 1989, abandoned, which is a continuation of Ser. No. 287,738, Dec. 21, 1988, Pat. No. 5,017,973.

[30] Foreign Application Priority Data

Oct. 21, 1988 [JP] Japan ................................ 63-263892
Jan. 10, 1989 [JP] Japan ................................ 1-001390

[51] Int. Cl.⁵ .................. H01L 29/205; H01L 31/08; H01L 27/14
[52] U.S. Cl. ...................................... 257/25; 257/21; 257/443; 257/257; 257/184; 364/807; 307/201; 307/324; 385/14
[58] Field of Search ...................... 357/4, 16, 34, 22; 350/96.1; 364/807; 307/201, 324

[56] References Cited

U.S. PATENT DOCUMENTS

| | | | |
|---|---|---|---|
| 4,716,449 | 12/1987 | Miller | 357/4 |
| 4,849,799 | 7/1989 | Capaso et al. | 357/16 |
| 4,868,418 | 9/1989 | Imamura et al. | 357/16 |
| 4,884,119 | 11/1989 | Miller | 357/16 |
| 4,902,912 | 2/1990 | Capasso et al. | 357/16 |
| 4,906,865 | 3/1990 | Holler | 307/353 |
| 4,907,196 | 3/1990 | Mori et al. | 357/16 |

OTHER PUBLICATIONS

Nikkei Microdevices, Jul. 1988, pp. 53-65 and 66-71. This document is provided in Japanese. English translation unavailable to applicants' attorney.

H. Kurata, et al., "Nobel Quantum Well Optical Bistability Device Combined with a Negative Resistance Device", Technical Research Report of the Electronics Information Communication Society, vol. 88, No. 6, 1988, pp. 63-67. Provided in Japanese. English translation unavailable to applicants' attorney.

Susanta Sen, et al., "Integration of GaAs/AlAs Resonant Tunneling Diodes for Digital and Analog Applications with Reduced Circuit Complexity", Technical Digest of GaAs IC Symposium, Portland, Oregon, 13th-16th Oct. 1987, IEEE, pp. 61 ∝ 64.

Hans P. Graf, et al, "VLSI Implementation of a Neural Network Model", Computer, vol. 21, No. 3, Mar. 1988, IEEE, pp. 41-48.

Doug Conner, "Data Transformation Explains the Basics of Neural Networks", EDN Electrical Design News, vol. 33, No. 10, 12th May 1988, pp. 138-144.

*Primary Examiner*—Jerome Jackson
*Attorney, Agent, or Firm*—Fay, Sharpe, Beall, Fagan, Minnich & McKee

[57] ABSTRACT

A semiconductor device is disclosed, which includes a multiple negative differential resistance element having negative differential resistance characteristics at at least two places in the current-voltage characteristics, and which is suitable for constructing a neural network having a high density integration and a high reliability.

16 Claims, 11 Drawing Sheets

FIG. 8
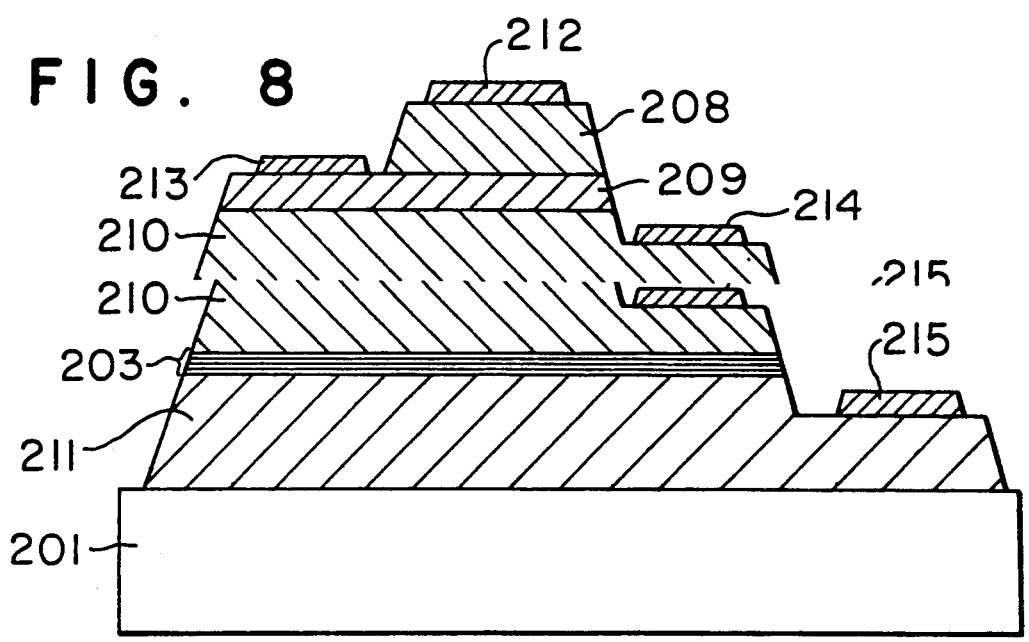
FIG. 9
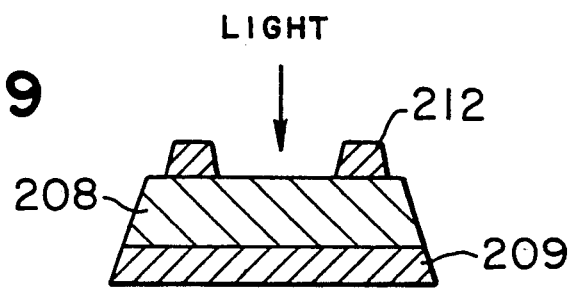
FIG. 10a  FIG. 10b  FIG. 10c
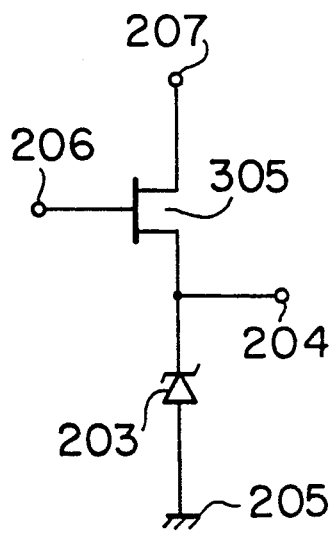 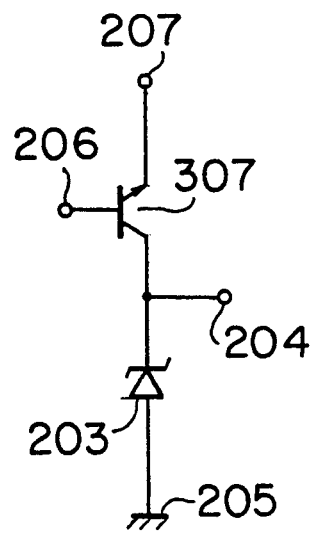 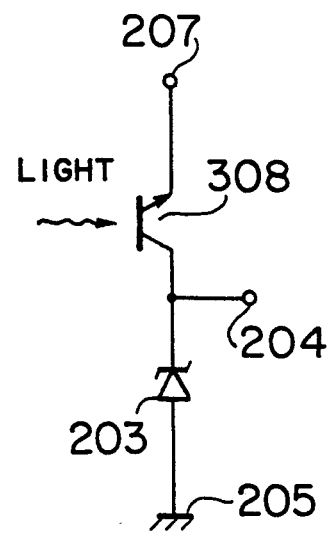

ELECTRIC CIRCUIT USING MULTIPLE DIFFERENTIAL NEGATIVE RESISTANCE ELEMENTS, SEMICONDUCTOR DEVICE AND NEURO CHIP USING THE SAME

This application is a continuation of U.S. Ser. No. 07/421,642 filed Oct. 16, 1989, now abandoned, which was a continuation-in-part of U.S. Ser. No. 07/287,738, filed Dec. 21, 1988, now U.S. Pat. No. 5,017,973, and assigned to the present assignee.

BACKGROUND OF THE INVENTION

The present invention relates to a semiconductor device suitable for constructing a neural network.

A neuro chip, in which an electronic circuit or a neural network substituted for neurons, which are elements constituting a neural network represented by a cerebrum and the function of the synapse, which is a coupling element between neurons in/outputting signals in/from the neurons, is realized on a semiconductor chip, is discussed e.g. in "Nikkei Micro Device (in Japanese)", July 1988, pp. 53–65.

The synapse, which is an important constituting element in a neuro chip as described above, is constructed e.g. by a variable conductance circuit and a neuron is composed of an operational amplifying circuit.

Heretofore, in order to realize a variable conductance circuit, MOSFETs have been used. For example, as indicated in FIG. 1a, it is possible to vary the channel conductance by varying the amount of electric charge stored in the gate 7 of a MOSFET 8. Further, as indicated in FIG. 1b, the conductance can be varied by connecting a number of FETs in parallel and by varying the number of FETs, which are in the on-state.

However, the method indicated in FIG. 1a has a problem from the point of view of the precision, the reproducibility and the reliability of the conductance, because the amount of the stored electric charge varies in the course of time because of the existence of leak current. On the other hand the method indicated in FIG. 1b has a problem that the number of FETs connected in parallel is too great and as the result the density cannot be increased, when it is intended to integrate them.

It is also tried to realize a neural network by using optical techniques and a synapse, in which a spacial light modulator, a hologram or an emulsion mask is used, is reported, ibid. pp. 66–71. Further, as an optical bistable element, whose transmission coefficient for input light varies in 2 levels, a semiconductor element, in which a double barrier resonant tunneling diode is combined with a p-n junction diode having a multiple quantum well structure, as described in "Technical Research Report of the Electronic Information Communication Society (in Japanese)" Vol. 88, No. 6, pp. 63–67 (1988).

It is expected that wiring, which would be complicated, if it were fabricated in the form of an electronic circuit, can be simplified by using light.

In the prior art neuro system, a neural network system using a special light modulator tube as a synapse stores a signal light pattern in the form of a pattern of electric charge formed on a surface of an $LiNbO_3$ crystal and the stored information is read out by using a laser light beam. Further in a system using a hologram as a synapse an $LiNbO_3$ crystal is used as the hologram material and the interference fringe of the signal light with the reference light is memorized. For these reasons, in these systems, it can be relatively easily effected to rewrite the stored information, which is inevitable for the learning function. However, since the construction of these systems is of large scale and complicated, it is difficult to try to integrate them.

On the other hand, in a system, in which an emulsion mask is used as the synapse, it is possible to form it on one chip by dividing the emulsion mask into a number of regions in a matrix form and by storing the transmission coefficient of each of the regions while varying it with weight of $\pm 0$, $\pm 1$, $\pm 2$. However, the information, which has been once written in the mask, is fixed and since it cannot be rewritten, it has no learning function.

On the other hand, in the optical bistable element, in which a double barrier resonant tunneling diode is combined with a p-n junction diode having a multiple quantum well structure, the transmission coefficient for the input light can be varied only in two levels and therefore the multiple-valued logic signal processing, which is inevitable for a neuron system, is impossible.

SUMMARY OF THE INVENTION

An object of the present invention is to provide a multiple level variable conductance element, which is scarcely subjected to influences of leak current and has an excellent reproducibility and which is suitable for a high density integration.

Another object of the present invention is to provide a neuro chip having a high density integration and a high reliability.

Still another object of the present invention is to provide an optical multi-stable device, in which the light transmission coefficient varies in a number of levels and which is suitable for a high density integration.

Further still another object of the present invention is to provide an optical neuro system having a high density integration and a learning function.

The above objects can be achieved by using as a synapse a multiple level variable conductance circuit consisting of a multiple negative differential resistance element having negative differential resistance characteristics at at least 2 places in the current-voltage characteristics, a load element therefor and a variable conductance element connected with the connecting point between the multiple negative differential resistance element and the load element stated above in a series circuit thereof.

They can be achieved also by using as a synapse an optical multi-stable element consisting of a multiple negative differential resistor and a p-i-n junction diode having a multiple quantum well structure.

BRIEF DESCRIPTION OF THE DRAWINGS

FIGS. 7 and 8 are cross-sectional views of multiple level variable conductance elements according to the present invention;

FIG. 9 is a partial cross-sectional view of a multiple level variable conductance element according to the present invention;

FIGS. 10a, 10b and 10c are equivalent circuit diagrams of multiple level variable conductance elements according to the present invention;

DETAILED DESCRIPTION OF THE PREFERRED EMBODIMENTS

Figure 1A:
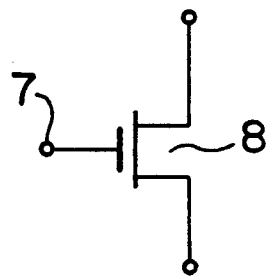
FIGS. 1a and 1b show prior art variable conductance circuits.

At first, a case where a multiple level variable conductance element is used as a synapse is explained.

In a multiple level variable conductance element having the construction described previously, it is possible to restrict the conductance, which the variable conductance element can have, to several discrete values by using a multiple negative differential resistor and a load. In this way the reproducibility of the signal outputted from the variable conductance and the setting precision are improved. Further, owing thereto, it is possible to read out the output signal with a high precision. In addition, since the number of elements is small, it becomes easier to integrate them.

Hereinbelow the preferred embodiments of the present invention will be described, referring to the drawings.

EMBODIMENT 1

Figure 2:
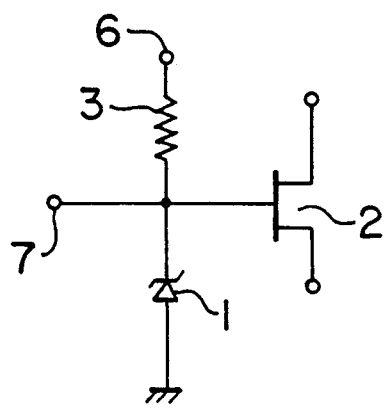
FIGS. 2, 3 and 4 show multiple level variable conductance circuits according to the present invention.

FIG. 2 is a circuit diagram indicating a multiple level variable conductance circuit according to the present invention.

In FIG. 2, reference numeral 1 is a multiple negative differential resistor; 2 is an FET having a variable conductance; 3 is a load resistor; 6 is a power source terminal; and 7 is a control voltage input terminal.

Figure 5A:
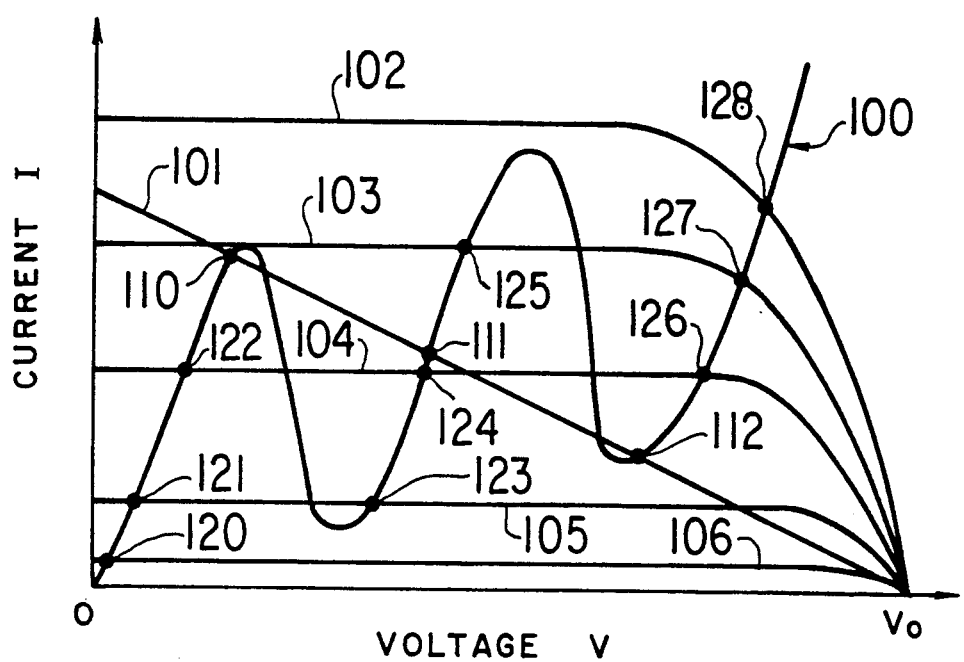
FIGS. 5a and 5b are schemes indicating electric characteristics for explaining the operation of the multiple level variable conductance circuits according to the present invention.

The multiple negative differential resistor 1 stated above has current-voltage characteristics as indicated by a curve 100 in FIG. 5a. Although the characteristics of the curve 100 indicated in FIG. 5a are double negative resistance characteristics, since there are no significant differences in the essential circuit operation from the case of the double negative resistor also for elements having triple or more multiple negative resistance characteristics, hereinbelow the operation will be explained by using the double negative resistance characteristics, i.e. the curve 100 indicated in FIG. 5a. The characteristics as indicated by the curve 100 in FIG. 5a can be realized by connecting usual negative resistance elements in series.

In the circuit indicated in FIG. 2, denoting the power source voltage by $V_0$ and the voltage applied to the multiple negative differential resistance element 1 (hereinbelow called simply element 1) by V, the voltage applied to the load resistor 3 is equal to $V_0 - V$. Since the current flowing through the gate of the FET 2 can be neglected, the current flowing through the element 1 is equal to the current flowing through the load resistor 3, which is represented by I. Further, since the voltage drop across the load resistor is represented by the product of the resistance R of the load resistor 3 and the current I, $$V_0 - V = R.I \tag{1}$$

is valid, which can be rewritten to $$V = V_0 - R.I \tag{1'}$$

The characteristics represented by Eq. (1)' are indicated by a straight line 101 in FIG. 5a.

As it is clear from the above description, intersections of the straight line 101 with the curve 100 are points of operation of this circuit. Among them those which are stable are 3 points, 110, 111 and 112. That is, the gate potential of the FET 2 should be the potential represented by either one of 110, 111 and 112. The switching-over of these potentials can be effected by grounding the control voltage input terminal 7 through a resistor having a suitable resistance.

Figure 3:
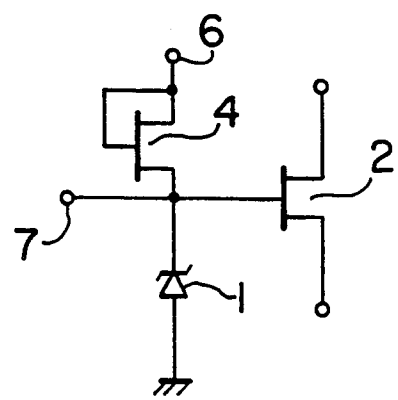
Figure 4:
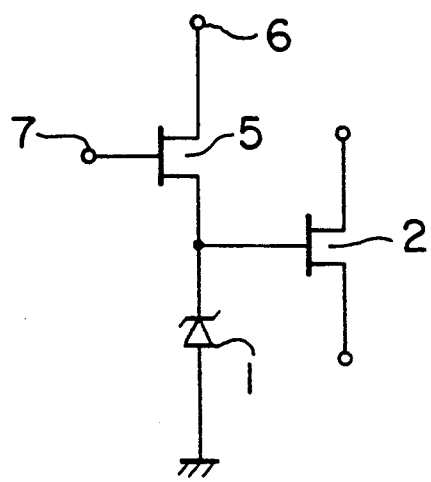
Figure 6:
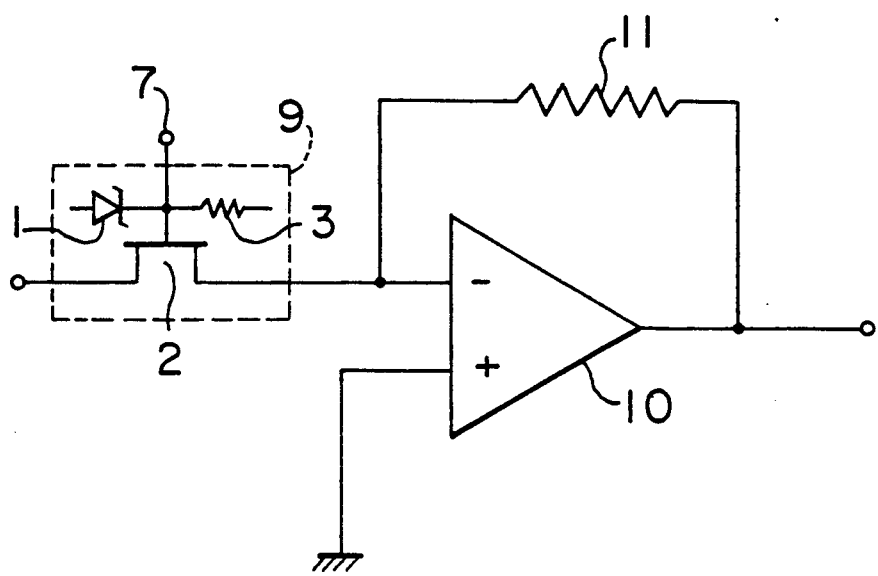
FIGS. 6 and 12 are schemes illustrating circuits, to which the multiple level variable conductance according to the present invention is applied.

Considering now an operational amplifier having an FET represented by the FET 2 in FIG. 2 as the input conductance, it can be expressed as indicated in FIG. 6. Further, circuits described later, in which FETs are used as load resistors, as indicated in FIGS. 3 and 4, can be similarly applied thereto instead of the circuit indicated in FIG. 2.

In FIG. 6, the input conductance circuit 9 corresponds to the circuit indicated in FIG. 2. The FET 2 in FIG. 2 is connected as the input conductance, as indicated in the Figure. In this circuit, since the input terminal of the operational amplifier 10 is at a virtual ground voltage, the voltage between the source and the gate of the FET 2 constituting the input conductance is equal to the voltage V applied to the element 1. Consequently the conductance of the FET 2 is varied in multiple levels by varying the voltage V in multiple levels, as described previously. In the operational amplifier circuit indicated in FIG. 6, since the amplification factor is represented by the product of the value of the input conductance and the resistance of the feedback resistor 11, it is possible to vary the amplification factor of this operational amplifier circuit.

According to the present invention, it is possible to vary the conductance in multiple levels by using a small number of elements with a high precision, a high reproducibility and a high reliability.

EMBODIMENT 2

FIG. 3 is a circuit diagram of another multiple level variable conductance according to the present invention.

This multiple level variable conductance is a circuit, in which the load resistor 3 indicated in FIG. 2 described previously is replaced by a normally-on type load FET 4.

There are differences in the current-voltage characteristics, depending on whether the load is a resistor or an FET. As the result, in the present embodiment, a curve 104 in FIG. 5a corresponds to the straight line 101 in the same figure. As the result, points of operation are represented by 122, 124 and 126.

Since the multiple level variable conductance indicated in the present embodiment requires no resistor element and it can be constructed only by two kinds of elements, i.e. FETs and a multiple negative differential resistor, no fabrication step for forming resistor elements is necessary at the integration and therefore it is more advantageous than that indicated EMBODIMENT 1 described above.

EMBODIMENT 3

FIG. 4 is a circuit diagram of still another multiple variable conductance according to the present invention.

The present circuit differs from that indicated in FIG. 3 consists in that the control voltage input terminal 7 is the gate terminal of the load FET 5. For this reason, the load curve varies, depending on the gate voltage, i.e. the potential at the control voltage input terminal 7 in FIG. 4, as indicated by curves 102 to 106 in FIG. 5a. For example, in the case where the load curve is represented by 106, the point of operation is at 120. Next, when the potential at the control voltage input terminal 7 is varied so that the load curve is changed to 105 or 104, the point of operation is changed to 121 or 122. Further, when the load curve is changed to 103, a jump of the point of operation takes place and the point of operation is at 125. At this time, when the control voltage is varied so that the load curve returns to 104, the point of operation goes to 124.

Figure 5B:
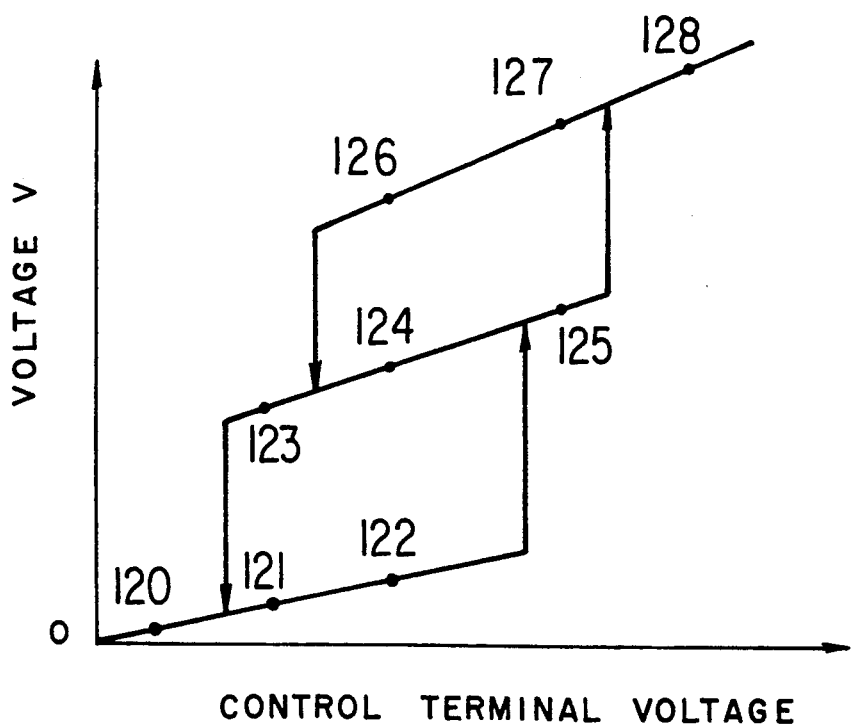

FIG. 5b indicates the operation described above in a graph, the ordinate representing the voltage at the working point, the abscissa the control terminal voltage. The voltages at the points of operation indicated in FIG. 5a are also indicated in the figure. Arrows in the figure indicate the direction of the jump of the point of operation. For example, the points 122, 124 and 126 are on a same load curve and it can be easily understood from FIG. 5b that the switching over among them can be effected by varying the control terminal voltage in a short pulse shape and returning it thereafter to the initial value. That is, in this case, it is possible to switch over the point of operation by using a pulsed voltage signal from the exterior and therefore the present mode of realization has an advantage that the external circuit can be simplified. The pulse duration of this pulsed voltage signal can be determined, depending on time constants such as the response time of the FETs and the negative resistor element, delay time determined by parasitic capacitance of wiring, etc. and the resistance, etc. However it is desirable that it is more than 3 times as long as the time constants described above.

Furthermore the parts, in which FETs are used in EMBODIMENTs 1, 2 and 3, can be operated similarly also by using bipolar transistors instead thereof.

EMBODIMENT 4

Figure 7:
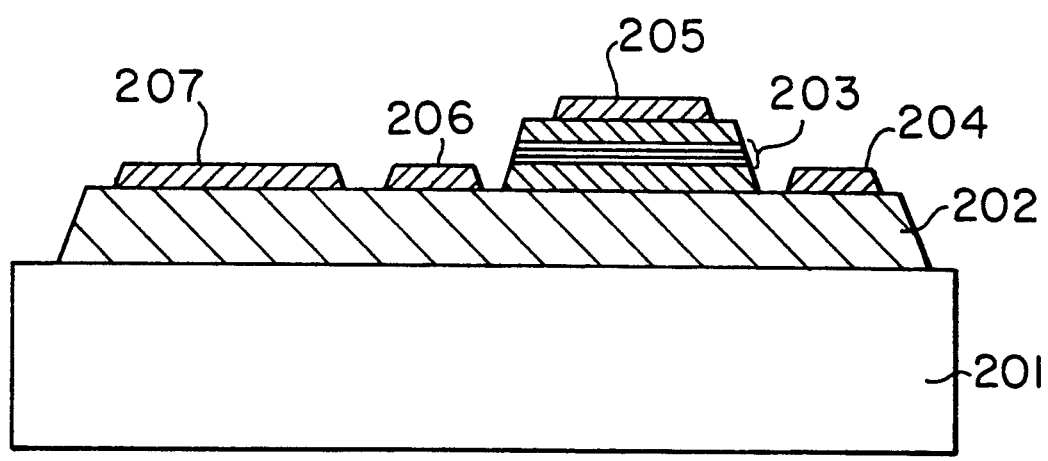

FIG. 7 is a cross-sectional view illustrating the construction of a semiconductor device realizing the part of the multiple negative differential resistor and the load FET in a multiple level variable conductance circuit according to the present invention.

In FIG. 7, an n conductivity type GaAs channel layer 202 (n:$2 \times 10^{17}$/cm$^3$, 200 nm (2000 Å) thick), a multiple level negative resistance diode 203 (multiple negative differential resistance element), ohmic electrodes 204, 205 and 207, and a schottky gate electrode 206 are formed on a semi-insulating GaAs substrate 201.

The ohmic electrodes 204, 205 and 207 are made of an AuGe alloy and the Schottky gate electrode 206 is made of Al. However any other materials can be used for them, if they can form ohmic contacts and a Schottky contact, respectively.

Further, the multiple negative resistance diode 203 has a structure, in which a quantum well layer consisting of an AlAs layer 2 nm (20 Å) thick, a GaAs layer 5 nm thick and an AlAs layer 2 nm thick (double barrier structure, all of them are undoped) and an n conductivity type GaAs (n:$1 \times 10^{18}$/cm$^3$) 50 nm thick are superposed alternately on each other two times and the whole is put up and down between 2 n conductivity type GaAs layers (n:$1 \times 10^{18}$/cm$^3$) 200 nm thick. Although, in the present embodiment, 2 quantum well layers are used in order to realize the double negative differential resistance characteristics, the number of superposition of quantum well layers may be increased correspondingly in order to realize triple, quadruple or more multiple negative resistance characteristics.

The equivalent circuit of the structure of the semiconductor device indicated in FIG. 7 stated above is indicated in FIG. 10a, in which reference numeral 305 represents an FET.

When the terminal 204 of the circuit indicated in FIG. 10a as described above is connected with the gate of another FET, it is possible to construct the circuit indicated in FIG. 3 stated above. Namely, according to the present EMBODIMENT, it is possible to form easily circuits indicated in EMBODIMENT 3 in FIG. 3 stated above on a same substrate and thus to integrate easily a number of variable conductance circuits indicated in EMBODIMENT 3.

The numerical values used here of the thickness of the channel layer, the carrier density, the thickness of the quantum well layer, etc. are not at all absolute and also the material is not restricted to GaAs, but InGaAs, AlGaAs, etc. may be used therefor as well. In short, the essential feature of the present invention is that the multiple barrier diode is integrated on the FET structure. Further the electrode arrangement is not necessarily that indicated in FIG. 7. For example, the output electrode 204 may be disposed on the channel layer 202 between the gate electrode 206 and the multiple negative differential resistance diode 203 or on the side wall of the diode.

EMBODIMENT 5

FIG. 8 is a cross-sectional view of a semiconductor device, in which the part of the multiple negative differential resistor and a load bipolar transistor of still another multiple level variable conductance according to the present invention is realized.

In FIG. 8, an n conductivity type GaAs channel layer 211, a multiple level negative resistance diode layer 203, an n conductivity type GaAs collector layer 210 (n:$5 \times 10^{16}$/cm$^3$, 400 nm (4000 Å) thick), a p conductivity type GaAs base layer 209 (p:$1 \times 10^{19}$/cm$^3$, 100 nm thick) and an n conductivity type Al$_{0.3}$Ga$_{0.7}$As emitter layer 208 (n:$1 \times 10^{17}$/cm$^3$, 200 nm thick) are formed on an semi-insulating GaAs substrate 201, and ohmic electrode 212, 213, 214 and 215 are formed further thereon.

The electrode 213 stated above is made of an AuZn alloy and the other electrodes are made of AuGe. They form ohmic contacts with the respective p and n conductivity type layers.

The equivalent circuit of the multiple level variable conductance described in the present embodiment is indicated in FIG. 10b. That is, in the present embodiment, the load element is a bipolar transistor 307, whose emitter, base and collector are composed of the layers 208, 209 and 210, respectively, and with which the multiple negative resistance diode 203 is connected in series.

In the present embodiment it is possible to obtain an effect similar to that obtained by the semiconductor device indicated in EMBODIMENT 4 described above by applying a suitable bias to the base of the bipolar transistor 307.

Further, although, in the present embodiment, a GaAs/AlGaAs heterojunction bipolar transistor is used, it may be replaced by a homojunction transistor. Furthermore it is a matter of course that a similar effect may be obtained also by using a heterojunction made of another material, e.g. InGaP/GaAs. InAlAs/InGaAs, etc., or a homojunction made of them.

EMBODIMENT 6

FIG. 9 shows the sixth embodiment of the present invention and is a partial cross-sectional view thereof indicating only the part of the emitter 208 and the base 209 in FIG. 8 stated above.

In the present invention a window is formed in the emitter electrode 212 as indicated in the figure so that light can enter the surface of the emitter from the exterior. In this way the bipolar transistor acts as a phototransistor 308.

The equivalent circuit of the multiple level variable conductance described in the present embodiment is indicated in FIG. 10c.

In the present embodiment it is possible to use a light pulse instead of a voltage or current pulse from the exterior for switching over the conductance.

Although the emitter electrode 212 of the bipolar transistor indicated in the present embodiment is made of AuGe, if a transparent electrode made of e.g. In$_2$O$_3$, SnO$_2$, etc. is used instead thereof, the window may not be necessarily formed in order to make light enter the emitter. Further, if light is made enter the emitter in the horizontal direction or in an oblique direction in the figure, a similar effect can be obtained also without forming any window.

EMBODIMENT 7

Figure 11:
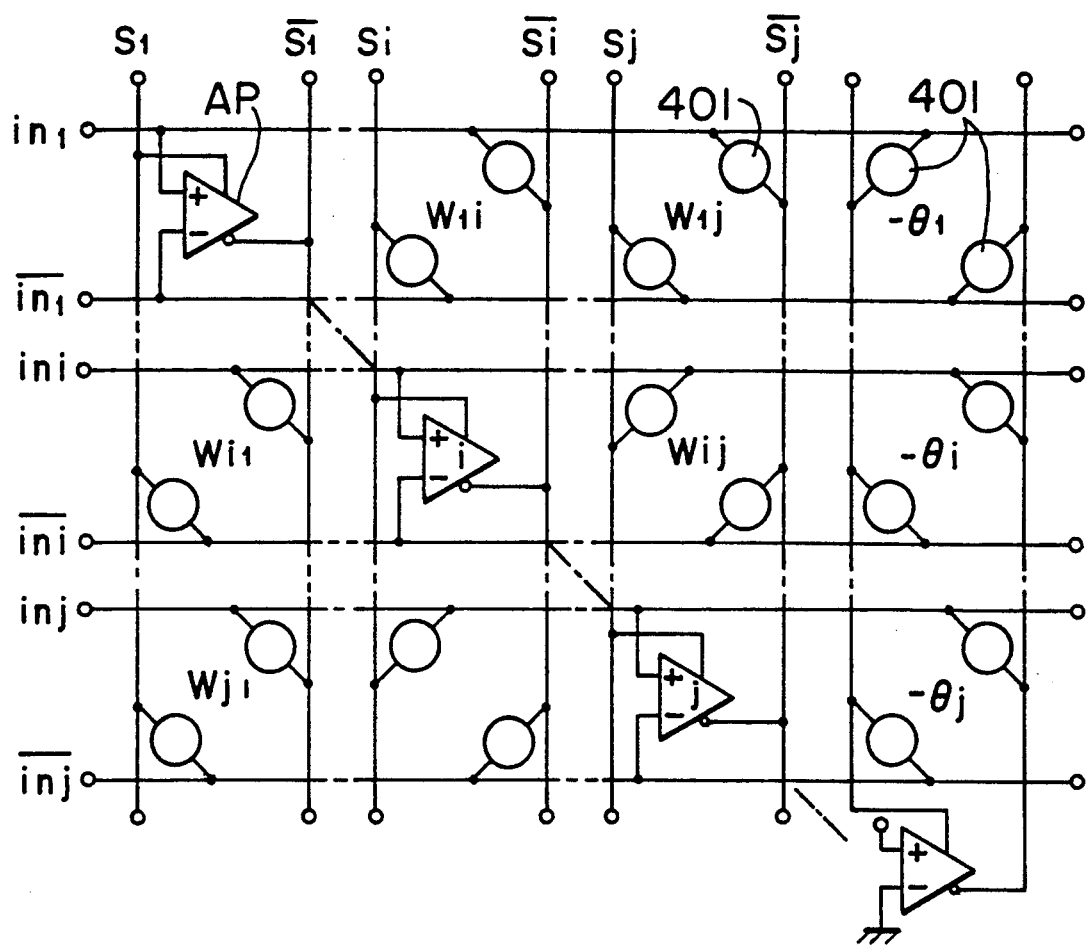
FIG. 11 is a scheme illustrating the circuit diagram of the neuro chip according to the present invention.

FIG. 11 is a scheme illustrating the circuit construction of an embodiment of the neuro chip, in which multiple level variable conductance circuits according to the present invention are used.

In FIG. 11, in$_I$ to in$_j$ and $\overline{in}_I$ to $\overline{in}_j$ represent input signals and their inverted signals, respectively. Further, the parts indicated by $\overline{W}_{ij}$ (i and j are natural numbers) are so-called synapses 401 (indicated by circular marks), which are multiple level variable conductance circuits described in EMBODIMENT 3 stated above. However, in this case, conductances variable in 8 levels are used therefor. for the synapse, the control voltage input terminal, etc. of the variable conductance circuit are omitted in the figure. Two terminals of the synapse 401 correspond to the two terminals of the FET 2 indicated in FIG. 3.

Each of the input lines is connected with an amplifier AP and axons Si, $\overline{Si}$, etc. through synapses. Various sorts of inputs and signals from the axon are weighted through the synapse and inputted in the input terminal of each of the amplifiers AP and the output signal of the amplifier is outputted again to the axon. That is, the input signal has a feedback circuit of amplifier - axon - synapse - amplifier and owing to this feedback the potential of each of the axons is stabilized at a certain value, depending on the coupling between the input signal and the synapse. This is the so-called neuro computing and the potential of the axon, i.e. the potential of Si and $\overline{Si}$ (i is a natural number), is the result of the operation.

Figure 1B:
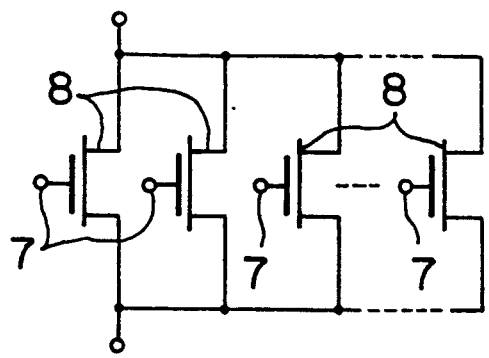

In the present embodiment, a chip was fabricated with 6 amplifiers and 30 synapses (in FIG. 11 only a part thereof is indicated). The elements required therefor are 5 FETs per amplifier and 12 elements per synapse and therefore the total number of necessary elements is 390. On the contrary, in the case where the prior art variable conductance circuit indicated in FIG. 1b is used as the synapse, the necessary number of FETs per synapse is 36 and therefore in total 1110 FETs are necessary in order to realize the same function as the neuro chip described in the present embodiment. Consequently, according to the present embodiment it is possible to reduce significantly the number of elements and to decrease remarkably the area of the chip. Further, in the case where the variable conductance circuit indicated in FIG. 1b is used, when the conductance is variable in 8 levels, 8 input lines per synapse are necessary for determining the conductance of each synapse. On the contrary, in the present embodiment, independently of the number of levels of the variability of the conductance, since one input line is sufficient for every synapse, it is possible to reduce remarkably the number of wires.

EMBODIMENT 8

Figure 12:
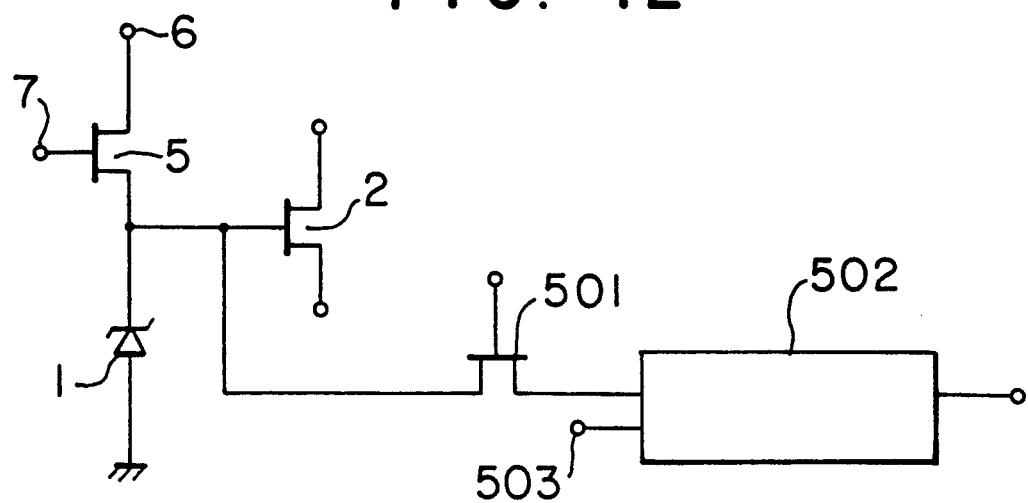

FIG. 12 is a circuit diagram of a circuit, to which the multiple level variable conductance described in the eighth embodiment of the present invention and which is a circuit, in which a reading-out FET 501, a discriminator circuit 502 and a reference input 503 are added to the circuit described in EMBODIMENT 3.

In the circuit indicated in FIG. 12, the reading-out FET 501 is usually turned-off and turned-on by applying a gate voltage thereto only at the read-out. Further the discriminator circuit 502 compares a signal from the reading-out transistor 501, i.e. the gate potential of the FET 2 serving as the variable conductance element (potential at the connecting point between the multiple negative differential resistance element 1 and the load FET 5) with the reference input 503 and outputs the difference therebetween and its sign in the form of signals. In this way it is possible to read-out the magnitude of the conductance of the variable conductance element 2 in a non-destructive manner.

As an example of utilization, this circuit can be used e.g. as the synapse 401 in the neuro chip in EMBODIMENT 7. When this circuit is used, the following points are made possible.

Firstly, since it is possible to read-out the state of coupling in the synapse, it is possible to copy completely the state of coupling of one neuro chip to another chip. The copy is effected as follows. At first, the state of coupling is read-out with a reference-input 503 of zero potential from a certain synapse on the chip to be copied and the signal thus obtained is used as a reference signal for the corresponding synapse in the destination chip. Then a signal pulse is inputted in the control voltage input terminal 7 of the destination synapse so that the output of the discriminator circuit 502 is zero. The copy of the state of coupling between different chips can be effected by repeating this procedure for all the synapses.

Secondly, it is possible to record the state of coupling in another medium, e.g. magnetic recording material, etc. by using a method similar to that used for the copy. It is called learning to vary the intensity in the coupling in the synapse so as to make the output of the neuro chip for a certain input be in accordance with an originally required output. According to the present embodiment it is possible to record and copy the result of learning.

According to the present invention it is possible to realize stably a multiple level variable conductance having a high precision and air excellent reproducibility with a small number of elements. Further the circuit according to the present invention has an effect that it can be easily integrated. Furthermore a number of excellent advantages can be obtained that a neuro chip, which can record and copy the state of coupling with a high precision, is realized, etc.

Now a case where an optical multi-stable device is used as the synapse will be described.

Figure 13A:
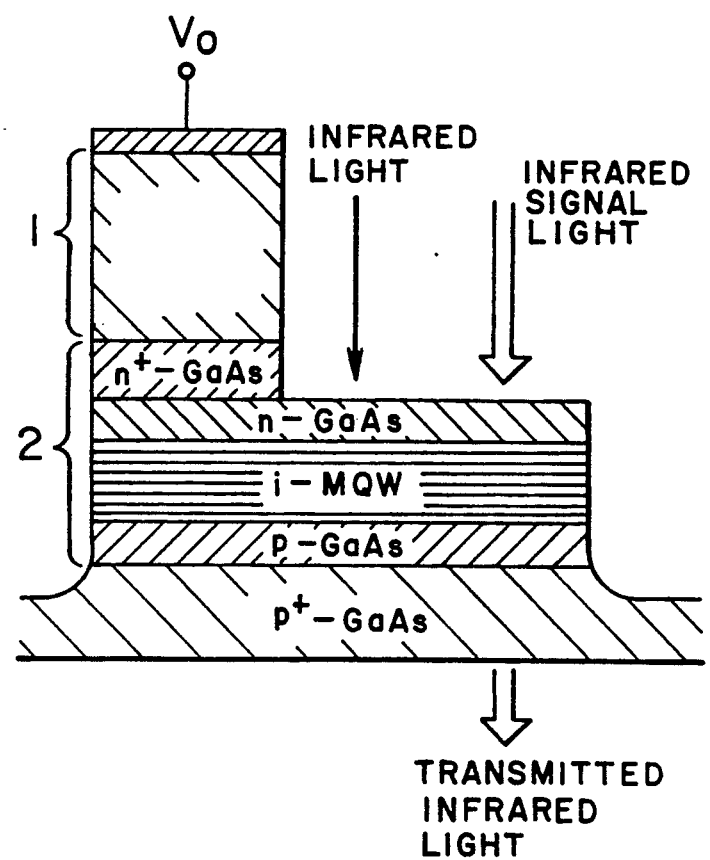
FIG. 13a is a cross-sectional view of an optical multi-stable element according to the present invention.
Figure 13B:
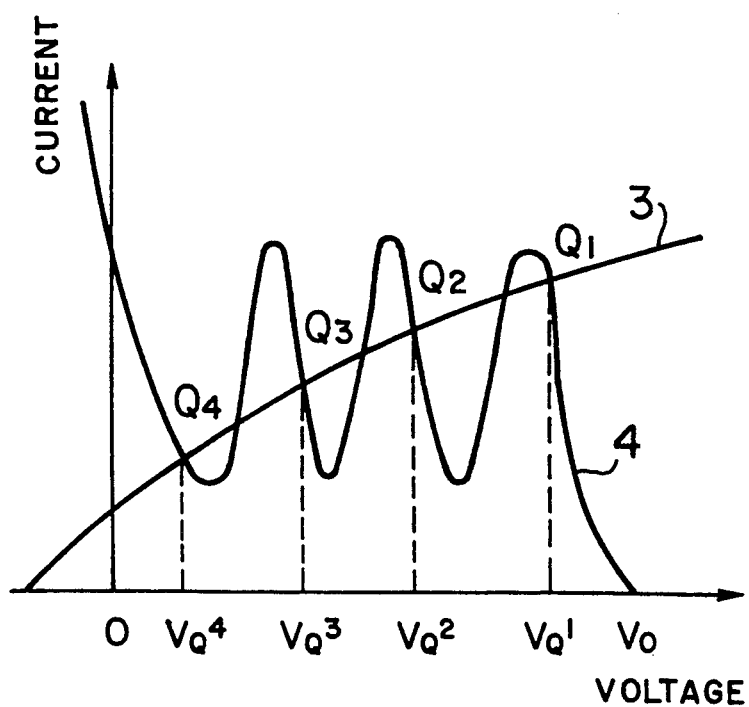
FIG. 13b is a scheme for explaining the point of operation of the optical multi-stable device according to the present invention.
Figure 13C:
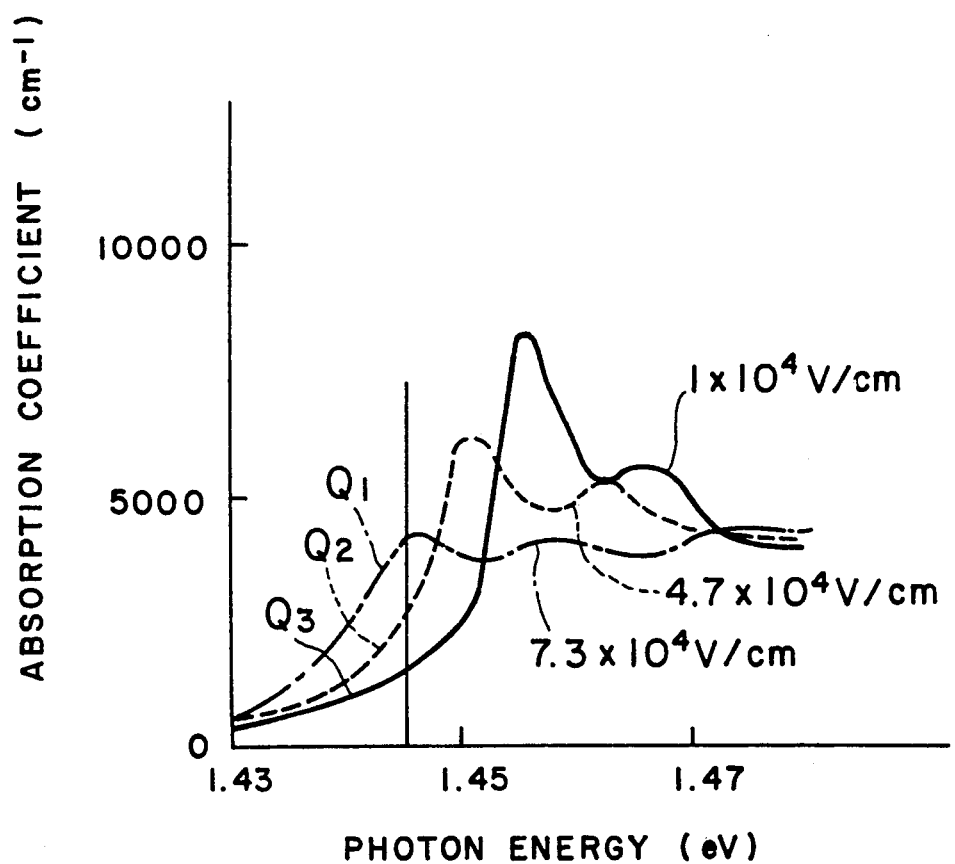
FIG. 13c is a graph showing variations in the light absorption coefficient of a multiple quantum well p-i-n diode constituting the optical multi-stable device according to the present invention.

The optical multi-stable device stated above consists of a multiple negative differential resistance device 1 and a multiple quantum well (MQW) p-i-n diode 2 connected in series and has a plurality of stable points indicated by $Q_1$ to $Q_4$ with respect to the applied external voltage $V_0$ owing to the fact that the current-voltage curve 4 representing the characteristics of the multiple negative differential resistance device 1 stated above intersects with the current-voltage characteristic curve 3 of the MQW p-i-n diode 2. The stable points stated above are points of operation for the applied external voltage $V_0$ and the device does not operate at the points other than the stable points stated above. In this case, the photo-current (Iph) 3 of the MQW p-i-n diode (FIG. 13b) is controlled by infrared light, with which the device is irradiated. At this time, the switching-over among the stable points $Q_1$ to $Q_4$ stated above is effected by superposing a pulse voltage $\Delta V_0$ on the external voltage $V_0$. On the other hand, the absorption coefficient of the MQW p-i-n diode 2 for infrared light varies as indicated in FIG. 13c, depending on the intensity of the electric field applied to the MQW (as known as quantum confined Stark effect). Now, when an infrared light having an energy of 1.445 eV is used as optical signal for the system (indicated by a segment of a full line in the figure), the absorption coefficient of the MQW increases with increasing intensity of the electric field. For this reason, as the optical multi-stable device is switched-over as $Q_1 \rightarrow Q_2 \rightarrow Q_3$ among the stable points stated above, as described above, the absorption coefficient of the MQW for the signal light is decreased in multiple levels as $1 \rightarrow 2 \rightarrow 3$. Consequently, when the optical multi-stable device according to the present invention is used as the synapse, it is possible to set and store the absorption coefficient for the signal light in a multiple-valued logical manner and to rewrite easily the stored information by varying the external voltage.

Figure 14A:
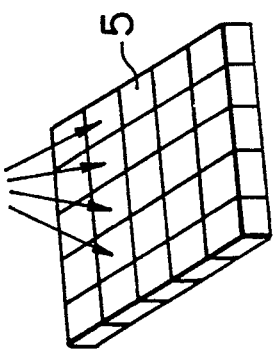
FIG. 14a is a perspective view of an optical filter, in which optical multi-stable elements are arranged in a matrix form.
Figure 14B:
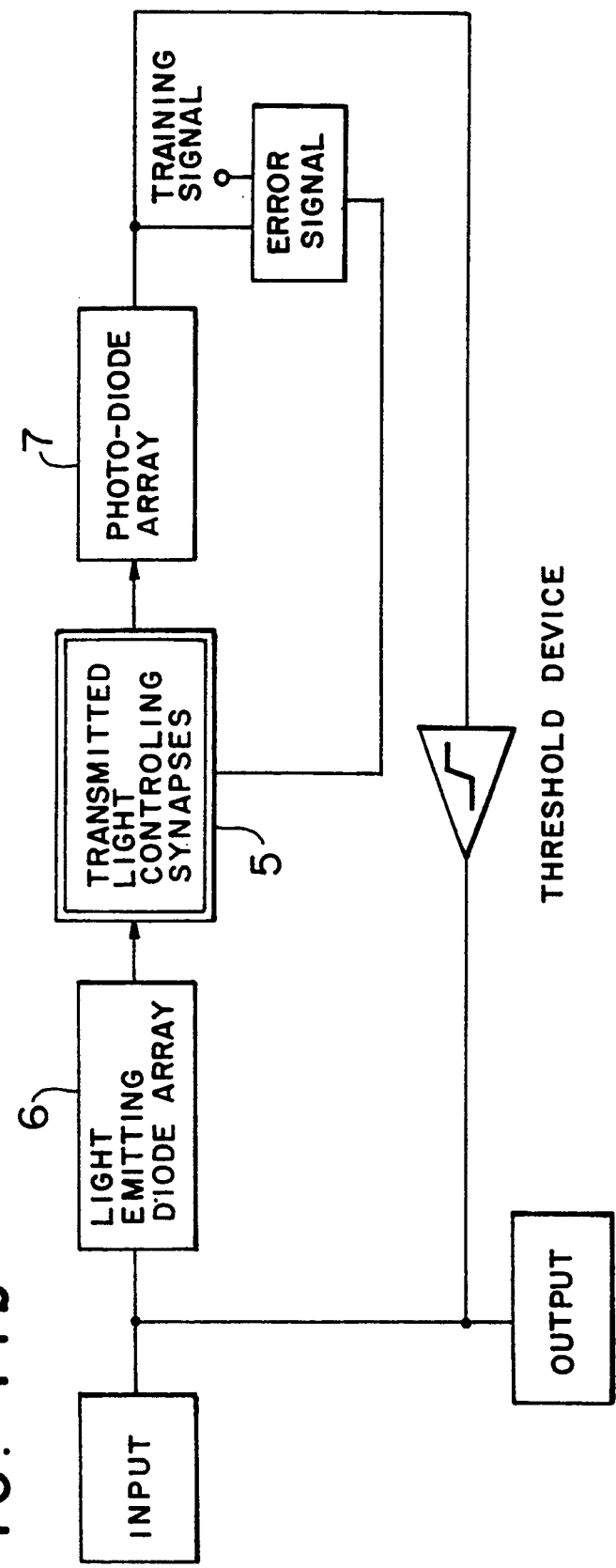
FIG. 14b is a block diagram indicating the construction of an optical neuro system, in which the optical multi-stable elements are used as synapses.

The optical multi-stable device can be arranged easily on one wafer in a matrix form, as indicated in FIG. 14a, and used as a transmitted light controlling synapse 5 rewritable in an optical neuro system. FIG. 14b indicates the construction of an optical neuro system using the optical multi-stable device according to the present invention and having the learning function. The signal projected by the light emitting diode array 6 is collected on a photodiode array 7 after having been treated by the transmitted light controlling synapse, in which optical multi-stable elements are arranged on a two-dimensional plane in a matrix form. The output signal thus obtained is compared with a training signal prepared previously. The result thereof is fedback to the transmitted light controlling synapse 5 in the form of a voltage pulse. The feedback signal stated above is applied to the external voltage terminal of each of the optical multi-stable elements to rewrite the stored information.

As described above, in the optical neuro system, in which optical multi-stable elements according to the present invention are used as the synapse, it is possible to rewrite stored information, which is inevitable for realizing the learning function, and further it is possible to integrate them.

EMBODIMENT 9

Figure 15A:
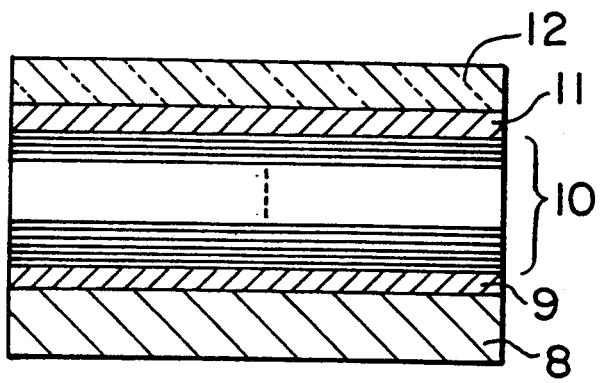
FIGS. 15a to 15e are cross-sectional views showing fabrication steps of the light multi-stable element according to the present invention.
Figure 15B:
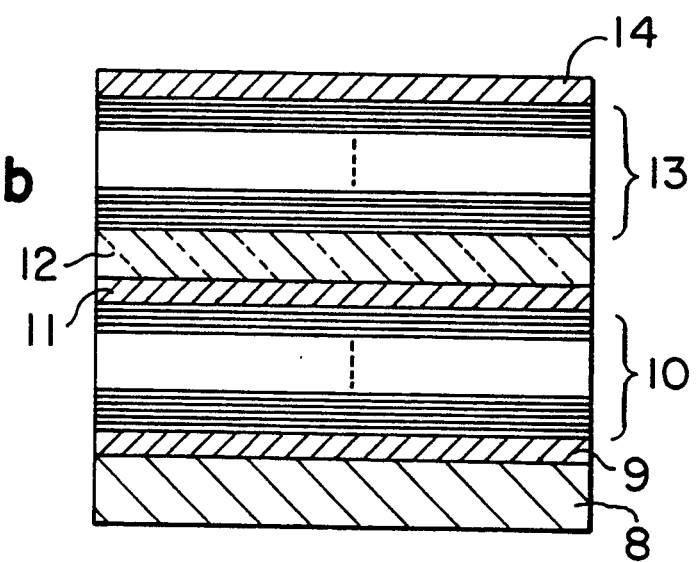
Figure 15C:
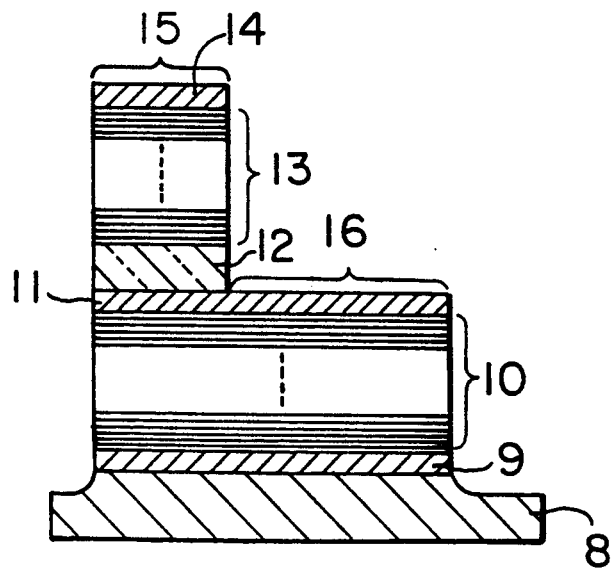
Figure 15D:
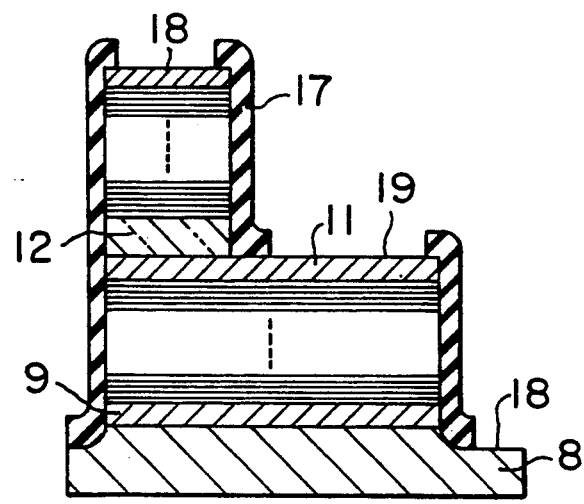
Figure 15E:
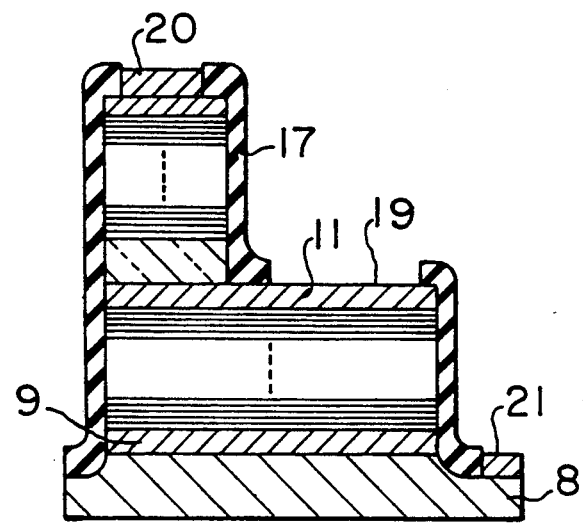
Figure 15F:
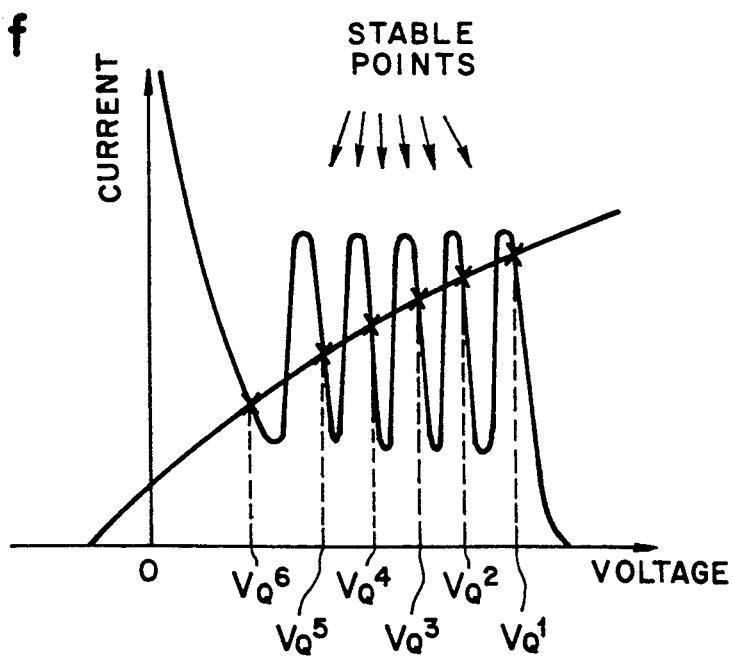
FIG. 15f is a graph for explaining the operation of the light multi-stable element according to the present invention.
Figure 16:
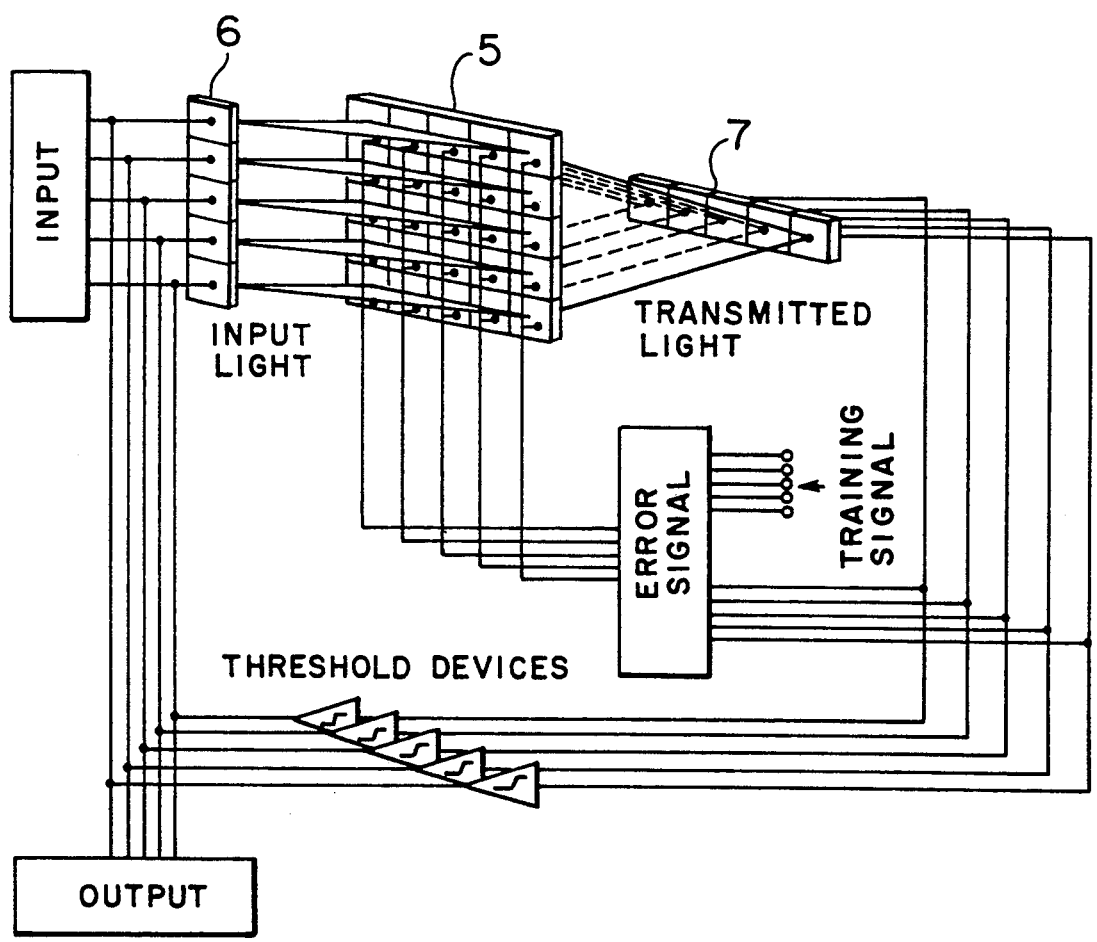
FIG. 16 is a scheme of a pattern recognizing device, in which light multi-stable elements according to the present invention are arranged in a matrix form as synapses.

Now an embodiment of the present invention will be explained, referring to the drawings. FIGS. 15a to 15e show the fabrication steps of the optical multi-stable element in cross-section, which are an embodiment of the present invention; FIG. 15f is a scheme showing the operation thereof; and FIG. 16 is a scheme illustrating the construction of a pattern recognizing device, in which optical multi-stable elements according to the present invention are used as the synapse. The optical multi-stable device indicated in FIGS. 15a to 15e as an embodiment is a device, in which a 5-layer structure diode having a double barrier resonant tunneling barrier structure is used as the multiple level negative differential resistance element. As indicated in FIG. 15a, a p conductivity type GaAs layer 9 (carrier concentration $3 \times 10^{17}/cm^3$, 50 nm thick) is grown on a p+ conductivity type GaAs substrate 8 by the MBE method and thereafter an MQW structure layer 10 is grown. It is supposed that the MQW structure layer 10 stated above is fabricated by repeating 100 times to superpose, from the p+ conductivity type GaAs substrate 8 side, an i-$Al_{0.3}Ga_{0.7}As$ layer (2.5 nm thick)/i-GaAs layer (10 nm thick) as a barrier layer (a semiconductor thin layer having a wide band gap) and a well layer (a semiconductor thin layer having a narrow band gap), respectively. Thereafter after an n conductivity type GaAs layer 11 (carrier concentration $3 \times 10^{17}/cm^3$, 50 nm thick) and an n+ conductivity type GaAs layer 12 (carrier concentration $1 \times 10^{18}/cm^3$, 300 nm thick) are grown again by the MBE method. Then, as indicated in FIG. 5b, a multiple level negative differential resistance portion 13 is grown by the MBE method. The multiple level negative differential portion 13 is constructed from the MQW structure side already grown, as indicated below. That is, a unit structure consists of 6 layers of n+-GaAs layer (carrier concentration $1 \times 10^{18}/cm^3$, 50 nm thick)/i-GaAs layer (30 nm thick)/i-Al$_{0.3}$Ga$_{0.7}$As layer (5 nm thick)/i-GaAs layer (5 nm thick)/i-Al$_{0.3}$Ga$_{0.7}$As layer (5 nm thick)/i-GaAs layer (30 nm thick). This unit structure is superposed 5 times and finally an n+-GaAs layer 14 (carrier concentration $1 \times 10^{18}/cm^3$, 300 nm thick) is grown. A mesa region 15 and a signal light and control light incidence region 16 are formed by the usual photolithographic technique, as indicated in FIG. 15c.

Then an SiO$_2$ layer 17 (400 nm thick) is grown by the CVD method and electrode forming regions 18 and a signal light and control light incidence hole 19 are formed. Next, as indicated in FIG. 15e, a cathode electrode 20 and an anode electrode 21 are formed by the usual lift-off method. For forming them AuGe/Ni/Au are deposited in thicknesses of 60/10/60 nm (600/100/600 Å), respectively, by evaporation.

The element fabricated as described above has 6 stable points, as indicated in FIG. 15f, and the transmission coefficient for the incident light, i.e. the stored information can be varied in 6 levels. A pattern recognizing device has been constructed by arranging an optical filter 5, in which optical multi-stable elements are arranged in an N×N matrix form, an array 6 consisting of N LEDs and an array 7 consisting of N photodiodes, as indicated in FIG. 6. An inputted two-dimensional pattern is represented by electric signals of N bits. They are transformed into light by the LED array 6 and thereafter the transmission coefficients of the transmitted light controlling synapses 5 therefor are weighted. The output signal is transformed into an electric signal by the photodiode array 7 and transmitted to a threshold value processing element. A part thereof is compared with a training signal previously given and fed back to the transmitted light controlling synapse 5 as an error signal. The signal stated above is applied to the external voltage terminal of the respective optical multi-stable element to rewrite the stored information (transmission coefficient). As described above, the present system can rewrite easily the stored information, which is indispensable for the learning function.

As explained above, the semiconductor device and the optical neuro system according to the present invention consists of a multiple negative differential resistance element having negative differential resistance characteristics at more than two places in the current-voltage characteristics and a p-n junction diode having a multiple well structure. In this way the stored information (transmission coefficient) for the incident light can be rewritten owing to the fact that the transmission coefficient of the present semiconductor device for the incident light is varied in multiple levels (multiple valued logic) and thus, when it is applied to an optical parallel processing system such as a super-parallel optical neuro computer, a pattern recognizing device, etc., a remarkable effect can be obtained for the increase in the learning function and the integration density.

We claim:

1. A multiple level variable conductance circuit, comprising:
    a multiple negative differential resistance diode having only first and second terminals and adapted to exhibit therebetween a voltage-current characteristic defining at least two different negative differential resistance regions;
    a load element having one and other terminals with its other terminal connected to said first terminal of said negative resistance diode wherein a given voltage difference is applied across said one terminal of said load element and second terminal of said negative differential resistance diode;
    a variable conductance element having a controllable gate terminal connected to said first terminal of said negative resistance diode; and
    means for selectively controlling current flowing through said load element and said multiple negative differential resistance diode through said terminals, whereby said load element is adapted to autonomously cause at least three stable voltage-current operations sequentially with said negative differential resistance diode in order to control said controllable gate of said conductance element.

2. A multiple level variable conductance circuit according to claim 1, further including an input terminal disposed to receive an input control voltage in order for the selective control of the current flowing through said load element and said negative resistance, thereby variably controlling voltage of said gate of said variable conductance element to change over its conductance by application of a selected input control voltage thereto to selectively shift stable operation of the multiple negative differential resistance diode between a low voltage stable operation level and a high voltage stable operation level.

3. A semiconductor device comprising:
    an operational amplifier having a first input terminal connected with an earth terminal, a first output terminal and a second input terminal connected with said first output terminal through a feedback resistor;
    a variable conductance element having a controllable gate terminal and a control-output terminal, a multiple negative differential resistance diode having only first and second terminals, and a load element wherein said load element is connected to said first terminal of said negative differential resistance diode, said controllable gate terminal is connected to said first terminal of said differential resistance diode; and,
    said control output terminal of said conductance element is connected to said second input terminal of said amplifier;
    wherein said multiple negative differential resistance diode is adapted to exhibit between said first and second terminals a voltage-current characteristic defining at least three positive characteristic regions and at least two negative differential resistance characteristic regions each of which intervene between said positive characteristic regions to isolate them from one another; and,
    wherein said load element and said negative differential resistance diode are voltage-controlled to cause their stable operations wherein said load element is adapted to autonomously cause at least three stable voltage-current operations sequentially with said negative differential resistance diode, thereby controlling said controllable gate of said conductance element.

4. A semiconductor device according to claim 3, further including a fourth input terminal connected, to said first terminal of said negative resistance diode, for applying a variable control voltage thereto.

5. A semiconductor device according to claim 3, wherein said load element comprises a further variable conductance element having a further input terminal to receive an input variable control voltage for the voltage control of said load element and said negative differential resistance diode.

6. A semiconductor chip provided with a plurality of means corresponding to synapses acting as in/output interfaces in/from neurons and between neurons, wherein each of said means corresponding to the synapses is composed of a multiple level variable conductance circuit comprising:

a variable conductance element having a controllable gate terminal and a control output terminal as a synapse output terminal, a multiple negative differential resistance diode having only first and second terminals, a load element and voltage control means; wherein said load element is connected to said first terminal of said negative differential resistance diode to thereby form a combination circuit of both said element and said diode, said controllable gate terminal is connected to said first terminal of said differential resistance diode, said voltage control means is connected to said combination circuit to voltage-control said first terminal of said differential resistance diode, said multiple negative differential resistance diode is adapted to autonomously exhibit between said first and said second terminals a voltage-current characteristic defining at least two different negative differential resistance regions;

said voltage control means is adapted to apply a voltage across said combination circuit and selectively apply a control voltage to said first terminal of said differential resistance diode to thereby procure at least three stable voltage-current operation regions of said load element and said differential resistance diode in response to control voltages selected respectively, said at least three stable voltage-current operation regions being isolated from one another by said at least two negative differential resistance regions and being procured for controlling said controllable gate terminal of said variable conductance element.

7. A device according to claim 6, wherein said load element is a resistor.

8. A semiconductor chip according to claim 6, wherein said voltage control means includes an input terminal, connected to said first terminal of said negative resistance diode, for applying a variable control voltage thereto.

9. A semiconductor chip according to claim 6, wherein said load element comprises a further variable conductance element having a control voltage input gate, and said voltage control means includes an input terminal for applying a variable control voltage to said voltage input gate for the application of control voltage to said first terminal of said difference resistance diode.

10. A semiconductor chip according to claim 6, wherein said synapses are arranged in a matrix form.

11. A multiple level variable conductance circuit comprising:

a multiple negative differential resistance diode having only first and second terminals and adapted to exhibit therebetween a voltage-current characteristic defining at least two different negative differential resistance regions;

a load element connected to said first terminal of said negative differential resistance diode to thereby form a combination circuit of both said element and said diode;

a variable conductance element having a controllable gate terminal connected to said first terminal of said negative differential resistance diode; and voltage control means for applying a voltage across said combination circuit and selectively applying a control voltage to said first terminal of said differential resistance diode, thereby procuring at least two stable voltage-current operation regions of said load element and said differential resistance diode in response to control voltages selected respectively, said at lest two stable voltage-current operation regions being isolated from one another by at least one of said two negative differential resistance regions and being procured for controlling said controllable gate terminal of said variable conductance element.

12. A circuit according to above claim 11, wherein said load element is a resistor, said voltage control means applies the control voltage to said first terminal of said differential resistance diode, thereby causing at least three stable voltage-current operations of said resistor and said differential resistance diode in response to control voltages selected respectively, said at least three stable voltage-current operations being isolated from one another by said at least two negative differential resistance regions and being caused for controlling said controllable gate terminal of said variable conductance element.

13. A circuit according to claim 11, wherein said load element is a normally-on type FET.

14. A circuit according to claim 11, wherein said load element is an FET and said voltage control means selectively applies a control voltage to a gate of said FET for voltage control of said first terminal of said differential resistance diode.

15. A semiconductor device comprising:

an operational amplifier having a first input terminal connected with an earth terminal, a first output terminal and a second input terminal connected to said first output terminal through a feedback resistor;

a variable conductance element having a controllable gate terminal and a control output terminal, a multiple negative differential resistance diode having only first and second terminals, a load element and voltage control means; wherein said load element is connected to said first terminal of said negative differential resistance diode to thereby form a combination circuit of both said element and said diode, said controllable gate terminal is connected to said first terminal of said differential resistance diode, said voltage control means is connected to said combination circuit to voltage-control said first terminal of said differential resistance diode, and said control output terminal of said conductance element is connected to said second input terminal of said amplifier; and wherein said multiple negative differential resistance diode autonomously exhibits between said first and said second terminals a voltage-current characteristic defining at least two different negative differential resistance regions; said voltage control means is adapted to apply a voltage across said combination circuit and selectively apply a control voltage to said first terminal of said differential resistance diode to thereby procure at least three stable voltage-current operation regions of said load element and said differential resistance diode in response to control voltages selected respectively, said at least three stable voltage-current operation regions being isolated from one another by said at least two negative differential resistance regions and being procured for controlling said controllable gate terminal of said variable conductance element.

16. A device according to claim 15, wherein said load element is a resistor.

* * * * *